United States Patent
Chen et al.

(10) Patent No.: US 10,025,435 B2
(45) Date of Patent: Jul. 17, 2018

(54) TOUCH PANEL

(71) Applicant: INDUSTRIAL TECHNOLOGY RESEARCH INSTITUTE, Hsinchu (TW)

(72) Inventors: Sin-An Chen, Yuanlin Township (TW); Chih-Chia Chang, Zhubei (TW); Sheng-Wei Chen, Jinhu Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 119 days.

(21) Appl. No.: 14/586,447

(22) Filed: Dec. 30, 2014

(65) Prior Publication Data
US 2015/0293624 A1    Oct. 15, 2015

Related U.S. Application Data

(60) Provisional application No. 61/979,023, filed on Apr. 14, 2014.

(30) Foreign Application Priority Data

Dec. 2, 2014   (TW) .............................. 103221337 U

(51) Int. Cl.
G06F 3/045     (2006.01)
G06F 3/044     (2006.01)
(Continued)

(52) U.S. Cl.
CPC .............. *G06F 3/044* (2013.01); *G06F 3/041* (2013.01); *G06F 2203/04111* (2013.01);
(Continued)

(58) Field of Classification Search
CPC .......... G06F 3/044; G06F 2203/04111; G06F 2203/04112; G06F 3/041; H05K 1/0296; H05K 1/0298
(Continued)

(56) References Cited

U.S. PATENT DOCUMENTS 8,274,494 B2    9/2012  Frey et al.
8,564,556 B2   10/2013  Lee et al.
(Continued)

FOREIGN PATENT DOCUMENTS

CN    202887770 U    4/2013
CN    203178974 U    9/2013
(Continued)

OTHER PUBLICATIONS

Granqvist et al., "Transparent and conducting ITO films: new developments and applications", Elsevier Science B.V., Thin Solid Films 411, 2002, pp. 1-5.
(Continued)

*Primary Examiner* — Jimmy H Nguyen
(74) *Attorney, Agent, or Firm* — Birch, Stewart, Kolasch & Birch, LLP

(57) ABSTRACT

A touch panel may include a substrate, a touch unit region and a covering layer. The touch unit region includes first electrode and a second electrode isolated from the first electrode. The covering layer covers at least one of the first electrode and the second electrode and has a touch surface. A distance between the touch surface and the first electrode or the second electrode ranges between 0.01 micrometers and 100 micrometers. A mutual capacitance value between the first electrode and the second electrode ranges between 0.1 pF and 10 pF when a touch has not occurred yet.

16 Claims, 12 Drawing Sheets

(51) Int. Cl.
*G06F 3/041* (2006.01)
*H05K 1/02* (2006.01)
(52) U.S. Cl.
CPC .. *G06F 2203/04112* (2013.01); *H05K 1/0296* (2013.01); *H05K 1/0298* (2013.01)
(58) Field of Classification Search
USPC .......................................................... 345/174
See application file for complete search history.

(56) References Cited

U.S. PATENT DOCUMENTS

| | | | |
|---|---|---|---|
| 8,629,841 B2 | 1/2014 | Degner et al. | |
| 8,717,330 B2 | 5/2014 | Lu et al. | |
| 9,250,753 B2 * | 2/2016 | Westhues | G06F 3/044 |
| 2007/0132365 A1 * | 6/2007 | Kang | H01L 27/3258 |
| | | | 313/500 |
| 2008/0236905 A1 | 10/2008 | Endo et al. | |
| 2010/0007616 A1 | 1/2010 | Jang | |
| 2010/0123670 A1 | 5/2010 | Philipp | |
| 2010/0238121 A1 * | 9/2010 | Ely | G06F 3/044 |
| | | | 345/173 |
| 2010/0328248 A1 | 12/2010 | Mozdzyn | |
| 2011/0210937 A1 | 9/2011 | Kee et al. | |
| 2011/0227868 A1 | 9/2011 | Chen et al. | |
| 2012/0057270 A1 * | 3/2012 | Foerster | H01L 28/60 |
| | | | 361/311 |
| 2012/0306777 A1 | 12/2012 | Kang et al. | |
| 2012/0327569 A1 | 12/2012 | Park et al. | |
| 2013/0038572 A1 | 2/2013 | Frey et al. | |
| 2013/0100053 A1 | 4/2013 | Kang et al. | |
| 2013/0162545 A1 | 6/2013 | Kim et al. | |
| 2013/0265247 A1 * | 10/2013 | Yang | G06F 3/041 |
| | | | 345/173 |
| 2014/0104511 A1 * | 4/2014 | Liu | G06F 3/01 |
| | | | 349/12 |
| 2014/0111709 A1 | 4/2014 | Kim et al. | |
| 2014/0198264 A1 | 7/2014 | Gao et al. | |

FOREIGN PATENT DOCUMENTS

| | | |
|---|---|---|
| CN | 103425375 A | 12/2013 |
| CN | 103472951 A | 12/2013 |
| CN | 103530010 A | 1/2014 |
| CN | 103713414 A | 4/2014 |
| CN | 104423682 A | 3/2015 |
| CN | 104750284 A | 7/2015 |
| CN | 104750285 A | 7/2015 |
| CN | 201525830 A | 7/2015 |
| EP | 2985684 A2 | 2/2016 |
| TW | M477575 U | 5/2014 |
| TW | 201546670 A | 12/2015 |

OTHER PUBLICATIONS

Guillen et al., "Comparison study of ITO thin films deposited by sputtering at room temperature onto polymer and glass substrates", Elsevier B.V., Thin Solid Films 480-481, 2005, pp. 129-132.
Ito et al., "Electrical and optical properties of amorphous indium zinc oxide films", Elsevier B.V., Thin Solid Films 496, 2006, pp. 99-103.
Kang et al., "Optical Properties of Sputtered Indium-tin-oxide Thin Films", Journal of the Korean Physical Society, Nov. 5, 2011, pp. 3280-3283, vol. 59, No. 5.
Minami et al., "Physics of very thin ITO conducting films with high transparency prepared by DC magnetron sputtering", Elsevier Science S.A., Thin Solid Films 270, 1995, pp. 37-42.
Synowicki, "Spectroscopic ellipsometry characterization of indium tin oxide film microstructure and optical constants", Elsevier Science S.A., Thin Solid Films 313-314, 1998, pp. 394-397.
Taiwanese Office Action and Search Report issued in Taiwanese Application No. 106103034, dated Aug. 18, 2017.
Taiwanese Office Action and Search Report for Taiwanese Application No. 105140981, dated Nov. 15, 2017.

* cited by examiner

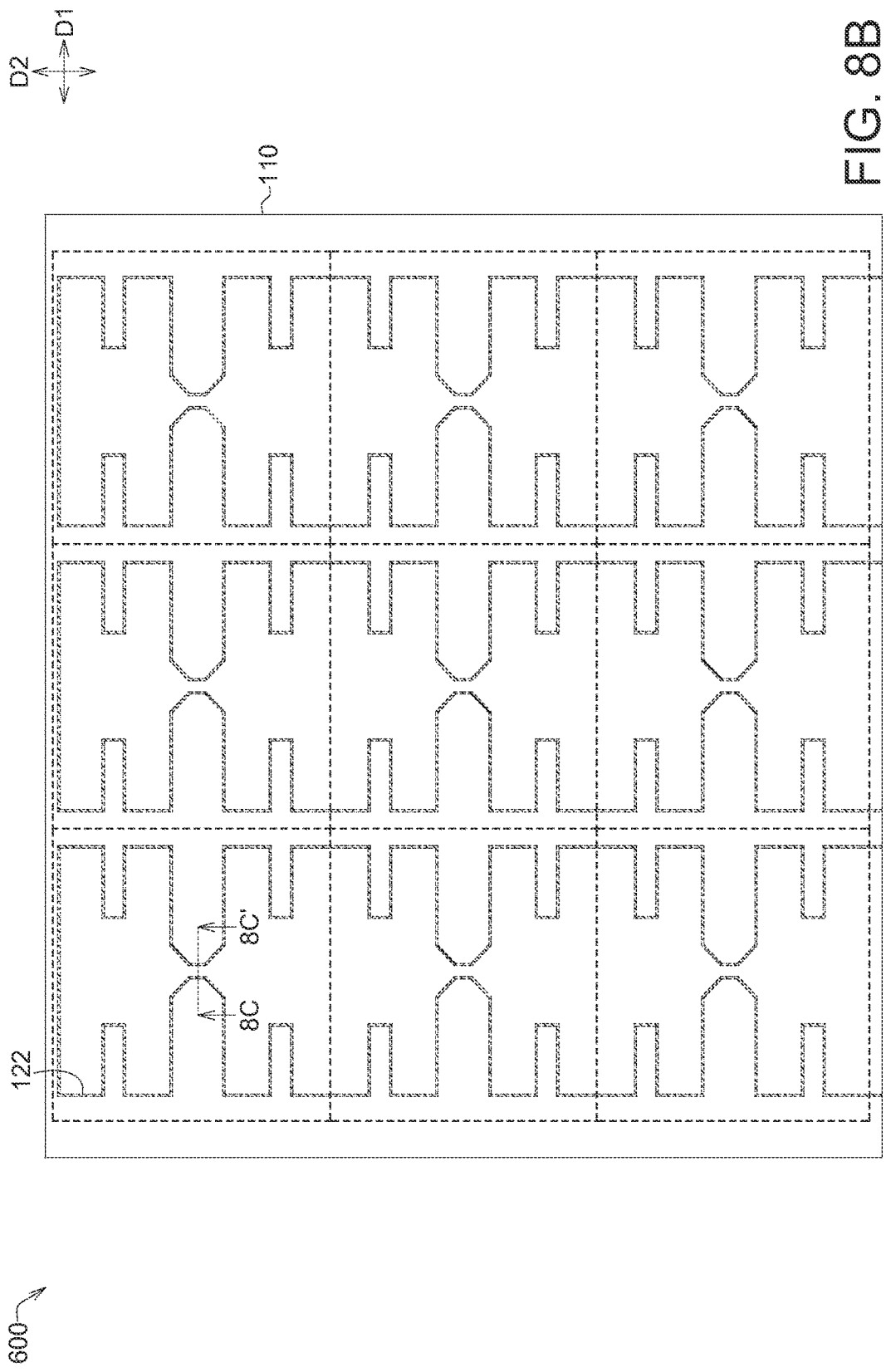

TOUCH PANEL

This application claims the benefit of U.S. provisional application Ser. No. 61/979,023, filed Apr. 14, 2014, the subject matter of which is incorporated herein by reference, and claims the benefit of Taiwan application Serial No. 103221337, filed Dec. 2, 2014, the subject matter of which is incorporated herein by reference.

TECHNICAL FIELD

The disclosure relates in general to a panel, and more particularly to a touch panel.

BACKGROUND

In general, a touch panel may include a cover lens for protecting sensing structures of the touch panel. To follow the trend of the thin and compact, it is considered that the cover lens is thinned or omitted.

However, such design makes it possible to cause the problem of an error response point to occur.

SUMMARY

According to one embodiment, a touch panel is provided. The touch panel may include a substrate, a touch unit region and a covering layer. The touch unit region may include first electrode and a second electrode isolated from the first electrode. The covering layer covers at least one of the first electrode and the second electrode and has a touch surface. A distance between the touch surface and the first electrode or the second electrode ranges between 0.01 micrometers and 100 micrometers. A mutual capacitance value between the first electrode and the second electrode ranges between 0.1 pF and 10 pF when a touch has not occurred yet.

The above and other aspects of the disclosure will become better understood with regard to the following detailed description of the preferred but non-limiting embodiment(s). The following description is made with reference to the accompanying drawings.

BRIEF DESCRIPTION OF THE DRAWINGS

FIGS. 8A to 8C show several diagrams of a touch panel according to another embodiment of the disclosure;

Figure 1A:
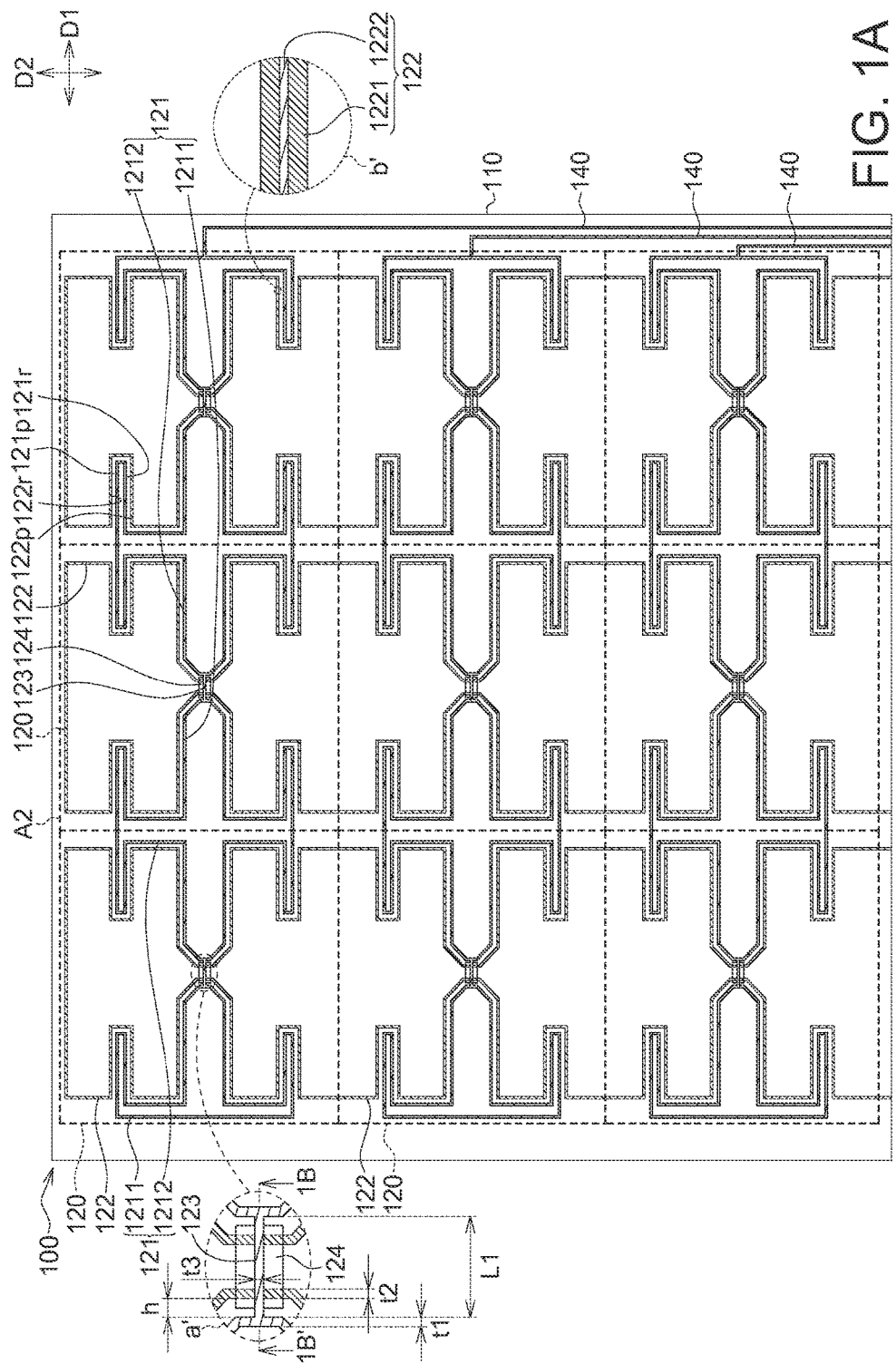
FIG. 1A shows a top view of a touch panel according to an embodiment of the disclosure.

In the following detailed description, for purposes of explanation, numerous details are set forth in order to provide a thorough understanding of the disclosed embodiments. It will be clear, that one or more embodiments may be practiced without these details. In other instances, well-known structures and devices are schematically shown in order to simplify the drawing.

DETAILED DESCRIPTION

Figure 1B:
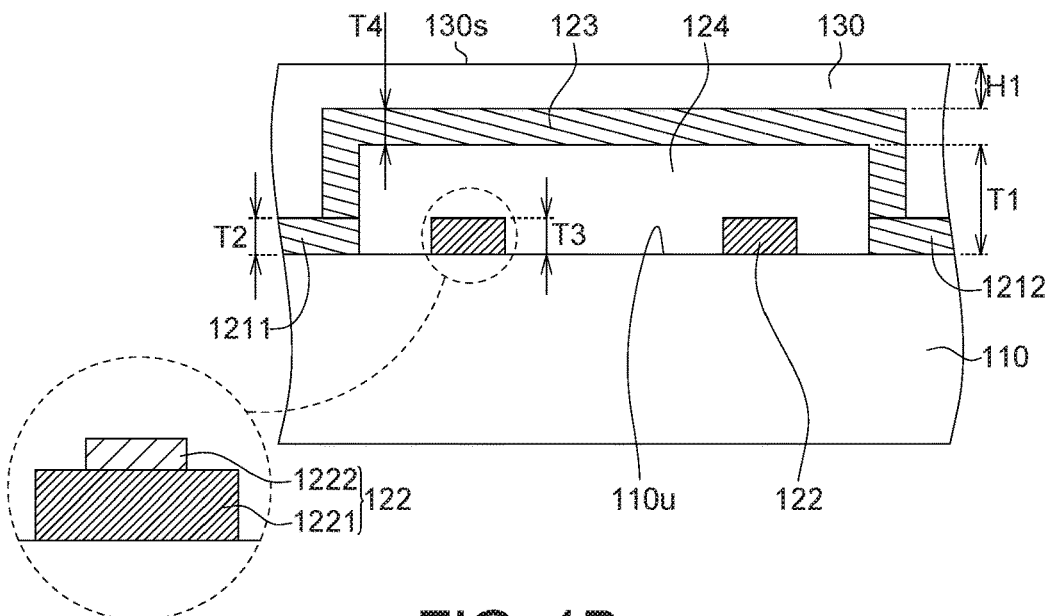
FIG. 1B shows a cross sectional view of the touch panel along a direction 1B-1B'.

Referring to FIGS. 1A and 1B, FIG. 1A shows a top view of a touch panel according to an embodiment of the disclosure, and FIG. 1B shows a cross sectional view of the touch panel along a direction 1B-1B'. The touch panel 100 includes a substrate 110, a plurality of touch unit regions 120 and a cover layer 130.

The substrate 110 is inflexible substrate or flexible substrate, for example. The substrate 110 may be made of glass, quartz or polymer such as polycarbonate (PC), polyethylene terephthalate (PET), polymethylmethacrylate (PMMA), polyethylene (PE), polyimide (PI), polyethersulfone (PES), polyacrylate (PA), polynorbornene (PNB), polyetheretherketone (PEEK), polyethylene naphthalate (PEN), polyetherimide (PEI) or Cyclic Olefin Copolymer, etc.

The touch unit regions 120 may be arranged as an n×m array, wherein n and m may be integers which are equal to or larger than 1, and n and m may be the same or different value. In the present embodiment, the touch unit region 120 may be arranged as 3×3 array. Each touch unit region 120 may include a first electrode 121, a second electrode 122, an electrode pad 123 and an insulation layer 124.

In the present embodiment, the first electrode 121 and the second electrode 122 may be formed on the same side of the substrate 110. For example, as shown in FIG. 1B, the first electrode 121 and the second electrode 122 are formed on a first surface 110u of the substrate 110. In another embodiment, the first electrode 121 and the second electrode 122 may be formed on opposite two sides respectively.

The first electrode 121 of each touch unit region 120 includes a first sub-electrode 1211 and a second sub-electrode 1212. The electrode pad 123 connects the first sub-electrode 1211 and the second sub-electrode 1212 for electrically connecting the first sub-electrode 1211 and the second sub-electrode 1212. The number of the electrode pad 123 of each touch unit region 120 is one, for example; however, such exemplification is not meant to be for limiting. The insulation layer 124 separates the electrode pad 123 from the second electrode 122 for electrically isolating the first electrode 121 and the second electrode 122 and preventing from the first electrode 121 being electrically short with the second electrode 122. In one embodiment, the insulation layer 124 has a thickness T1 (as illustrated in FIG. 1B) ranging 0.01 micrometers and 5 micrometers.

As shown in FIG. 1A, the second sub-electrode 1212 of the touch unit region 120 may connect with the first sub-electrode 1211 of the adjacent touch unit region 120 arranged in the same row (along a first direction D1, for example), such that the first electrodes 121 of adjacent two touch unit regions 120 connect with each other. Several first electrodes 121 of the touch unit regions 120 in the same row may connect to form a first axial electrode for sensing a touch. In addition, adjacent two first axial electrodes (that is, several first axial electrodes in a second direction D2) may not connect with each other for preventing from being electrically short with each other. In one embodiment, the touch panel 100 may further include a plurality of signal traces 140 each connecting with the corresponding first axial electrode and extending to a side of the substrate 110 for transmitting the signal for the first axial electrode.

In the present embodiment, the first electrodes 121 of the adjacent two touch unit regions 120 may be designed as a symmetrical structure and/or the second sub-electrode 1212 of the touch unit region 120 and the first sub-electrode 1211 of the adjacent touch unit region 120 may be designed as a symmetrical structure. In another embodiment, the first electrodes 121 of the adjacent two touch unit regions 120 may be designed as a non-symmetrical structure and/or the second sub-electrode 1212 of the touch unit region 120 and the first sub-electrode 1211 of the adjacent touch unit region 120 may be designed as a non-symmetrical structure.

As shown in FIG. 1A, the second electrodes 122 of the adjacent two touch unit regions 120 in the same column (in the second direction D2, for example) may connect with each other, such that the second electrodes 122 of the several touch unit regions 120 in the same column may be arranged as a second axial electrode for sensing the touch. In addition, adjacent two second axial electrodes (that is, several second axial electrodes in the first direction D1) may not connect with each other for preventing from being electrically short with each other.

The first electrode 121 and the second electrode 122 may be formed by winding electrode wires. The area of the electrode wires may be less than that of the touch unit regions 120, and accordingly an occupying area of the first electrode 121 and the second electrode 122 in the touch unit regions 120 may be reduced. As a result, the self capacitance value of the first electrode 121 and the self capacitance value of the second electrode 122 may be reduced when the touch occurs, and accordingly the problem of the error response point may be prevented (if a self capacitance increase time exceeds an allowed self capacitance increase time, the problem of the error response point will occur).

Figure 2:
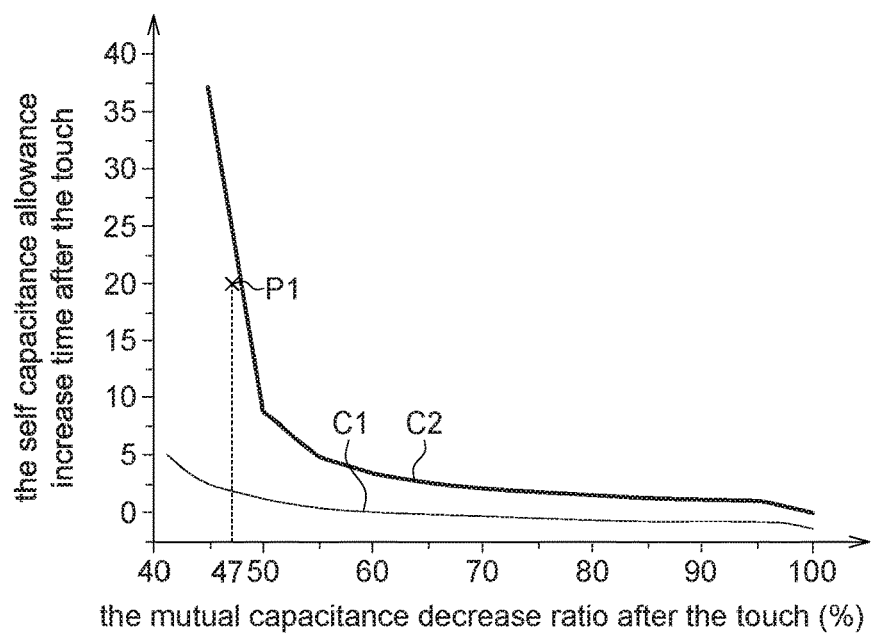
FIG. 2 shows a capacitance change diagram of the touch panel of FIG. 1A after and before being touched.

Referring to FIG. 2, a capacitance change diagram of the touch panel after and before being touched. In the present embodiment, the mutual capacitance between the first electrode 121 and the second electrode 122 ranges between 0.1 pF and 10 pF, for example. In FIG. 2, a curve C1 represents a relationship between the mutual capacitance decrease ratio and the self capacitance increase time after the touch in a conventional touch panel, and a curve C2 represents a relationship between the mutual capacitance decrease ratio and the self capacitance increase time after the touch in the touch panel 100. As shown trend of the curves C1 and C2, after the touch, in both the conventional touch panel and the touch panel 100, the mutual capacitance value between the first electrode and the second electrode decrease, and the self capacitance value of electrode (takes one of the first electrode 121 and the second electrode 122 for example) increase.

As shown in FIG. 2, in terms of the mutual capacitance decrease ratio being 47%, the allowed self capacitance increase time of the conventional touch panel is about 2.5 times, while the allowed self capacitance increase time of the touch panel 100 may reach 20 times, and accordingly the touch panel 100 prevents from the error response point occurring. In terms of the allowed self capacitance increase time of the first electrode 121, the first electrode 121 has a first base self capacitance value before the touch, the first electrode 121 has a first increase self capacitance value after the touch, and the allowed self capacitance increase time of the first electrode 121 is the ratio of the first increase self capacitance value to the first base self capacitance value. In the present embodiment, the allowed self capacitance increase time of the first electrode 121 is less than, equal to or larger than 37. Similarly, In terms of the allowed self capacitance increase time of the second electrode 122, the second electrode 122 has a second base self capacitance value before the touch, the second electrode 122 has a second increase self capacitance value after the touch, and the allowed self capacitance increase time of the second electrode 122 is the ratio of the second increase self capacitance value to the second base self capacitance value. The allowed self capacitance increase time of the second electrode 122 is less than, equal to or larger than 37.

In terms of the measurement for the allowed self capacitance increase time, for example, one terminal of a capacitance meter, for example a LCR meter (not illustrated) meter may connect the first electrode 121 or the second electrode 122 of the touch unit region 120, and another terminal of the LCR meter may be grounded. Then, a capacitance value of the first electrode 121 or the second electrode 122 is read to serve as a base self capacitance value. Then, a change capacitance value of the first electrode 121 or the second electrode 122 is read to serve as an increase self capacitance value after an insulation object or a conductive object approaches the touch unit region 120 or touch the touch unit region 120 through the cover layer 130. Then, the aforementioned steps may be repeated for several times (more than 10 times, for example), and then an average value of several base self capacitance values is calculated to serve as a base self capacitance average value, and an average value of several increase self capacitance values is calculated to serve as an increase self capacitance average value. Then, a ratio of the increase self capacitance average value to the base self capacitance average value is calculated to serve as the self capacitance increase time. In one embodiment, the measurement for the allowed self capacitance increase time may be performed under the circumstances of omitting the cover lens, thinning the cover layer 130 or omitting the cover layer 130.

In addition, if the cover lens is omitted or thinned, the self capacitance increase time is increased after the touch, and the error response point occurs (if the self capacitance increase time exceeds the allowed self capacitance increase time, the error response point will occur). For example, as shown in FIG. 2, under the circumstances of omitting or thinning the cover lens, the self capacitance increase time is about 20 times after the touch (the mutual capacitance decrease ratio being 47% is taken for example, as shown in the touch point P1), which is higher than the allowance range of the curve C1, and accordingly the error response point occurs.

Since the first electrode 121 and the second electrode 122 of the touch panel 100 have low self capacitance values, the self capacitance increase time is increased. In terms of the mutual capacitance decrease ratio being 47%, the allowed self capacitance increase time of the touch panel 100 may increase by 20 times. Under the design, even though the cover lens is omitted or thinned, or the cover layer 130 is omitted, the self capacitance increase time of the touch panel 100 is still lower than the range of the curve C2 after being touched (the touch point P1, for example), and accordingly the problem of the error response point may be resolved. In one embodiment, even though a distance H1 between a touch surface 130s of the cover layer 130 and the first electrode 121 or the second electrode 122 is less than or equal to 100 micrometers, or a distance H1 is 0.01 micrometers, the problem of error response point may still be resolved.

In addition, the self capacitance value and the mutual capacitance value of the electrodes may be reduced by several ways. For example, a width of the electrode, a ratio of an area of the electrode to an area of the touch unit region, an extension form of the electrode, a thickness of the electrode and/or a size of the electrode pad.

In terms of the width of the electrode, as shown in an enlargement diagram of a local portion a' of FIG. 1A, in one embodiment, the width t1 of the first electrode 121 and/or the width t2 of the second electrode 122 may range between 5 micrometers and 200 micrometers, and accordingly the self capacitance value may be reduced. In one embodiment, the width t1 of the first electrode 121 and/or the width t2 of the second electrode 122 may be different or substantially the same.

In terms of the area of the electrode, in one touch unit region 120, the first electrode 121 and the second electrode 122 occupy an electrode area A1, wherein a ratio (A1/A2) of the electrode area A1 to a unit area A2 (as shown in FIG. 1A) of the touch unit region 120 may be less than or equal to 50%, and accordingly the self capacitance increase time may be increased. In one embodiment, the unit area A2 may range about 9 mm$^2$ and about 49 mm$^2$.

In terms of extension form of the electrode, the first electrode 121 and the second electrode 122 may form any shape. For example, the first electrode 121 may form at least one recess 121r and at least one protrusion 121p, and the second electrode 122 may form at least one recess 122r and at least one protrusion 122p. In the present embodiment, the number of the protrusions 121p of the first electrode 121 of one touch unit region 120 is six, and the number of the recesses 121r of the first electrode 121 of one touch unit region 120 is four, for example. In another embodiment, the number of the protrusions 121p may be less or more than six, and the number of the recesses 121r may be less or more than four. In addition, the number of the protrusions 122p of the second electrode 122 of one touch unit region 120 is eight, and the number of the recesses 122r of the second electrode 122 of one touch unit region 120 is six, for example. In another embodiment, the number of the protrusions 122p may be less or more than eight, and the number of the recesses 122r may be less or more than six. The protrusion 121p of the first electrode 121 may insert the corresponding recess 122r of the second electrode 122, and the protrusion 122p of the second electrode 122 may insert the corresponding recess 121r of the first electrode 121, such that an interval h between the first electrode 121 and the second electrode 122 may decrease and become uniform. In one embodiment, the interval h ranges between 5 micrometers and 200 micrometers. In another embodiment, the interval h of the same touch unit region 120 may vary, for example, the same touch unit region 120 may have several different intervals h, such as 5 micrometers and 200 micrometers simultaneously.

In another embodiment, any of all or some touch unit regions 120 may include a plurality of electrode pads 123, wherein one of the electrode pads 123 may be formed between one protrusion 121p of the first sub-electrode 1211 and one opposite protrusion 121p of the second sub-electrode 1212 to connect the two protrusions 121p, and another of the electrode pads 123 may be formed between another protrusion 121p of the first sub-electrode 1211 and another opposite protrusion 121p of the second sub-electrode 1212 to connect the two protrusions 121p.

In terms of the thickness of the electrode, as shown in FIG. 1B, the thickness T2 of the first electrode 121 may range between 0.01 micrometers and 5 micrometers, and the thickness T3 of the second electrode 122 may range between 0.01 micrometers and 5 micrometers. In an embodiment, the thickness T1 is larger than the thickness T2 and the thickness T3.

In terms of the size of the electrode pad, as shown in FIG. 1A, the length L1 of the electrode pad 123 in the direction D1 may range between 100 micrometers and 1000 micrometers, and the width t3 of the electrode pad 123 may range 5 micrometers and 1000 micrometers. In one embodiment, the width t1 of the first electrode 121, the width t2 of the second electrode 122 and/or the width t3 of the electrode pad 123 may be different or substantially the same. In addition, as shown in FIG. 1B, the thickness T4 of the electrode pad 123 may range between 0.01 micrometers and 5 micrometers, for example.

In addition, the structure of the electrode may be a composite structure. For example, as shown in an enlargement diagram of a local portion b' of FIG. 1A and an enlargement diagram of FIG. 1B, the second electrode 122 includes a first conductive layer 1221 and a second conductive layer 1222 contacting with the first conductive layer 1221, wherein the conductivity of one of the first conductive layer 1221 and the second conductive layer 1222 may be greater than the conductivity of another of the first conductive layer 1221 and the second conductive layer 1222, and accordingly the whole conductivity of the second electrode 122 may be increased. For example, one of the first conductive layer 1221 and the second conductive layer 1222 may be made of metal, such as silver, and another of the first conductive layer 1221 and the second conductive layer 1222 may be made of transparent material, such as indium tin oxide (ITO), aluminum zinc oxide (AZO), ZnO, gallium zinc oxide (GZO), In$_2$O$_3$, indium zinc oxide (IZO), TiO$_2$, fluorine-doped tin oxide (FTO), SnO$_2$, CdO, conductive polymer (such as PEDOT:PSS), CNTs, etc. In addition, the first electrode 121 may have a composite structure similar to that of the second electrode 122, and the similarity is not repeated.

In addition, the area of the first conductive layer 1221 and the area of the second conductive layer 1222 may be the same or different. For example, the area of the second conductive layer 1222 may be less than the area of the first conductive layer 1221. In another embodiment, the area of the second conductive layer 1222 may be equal to the area of the first conductive layer 1221.

As shown in FIG. 1B, the cover layer 130 may cover the touch unit region 120 for protecting the electrode structures in the touch unit region 120. The cover layer 130 has a touch surface 130s, and user may operate the touch panel 100 through the touch surface 130s. Since the first electrode 121 and the second electrode 122 have low self capacitance values, the problem of the error response point may be prevented even though thinning the cover layer 130. In one embodiment, the distance H1 between the touch surface 130s and the first electrode 121 or the second electrode 122 may range 0.01 micrometers and 100 micrometers, such as 15 micrometers. The distance H1 may be the shortest distance between the touch surface 130s and the first electrode 121, the second electrode 122 or the electrode pad 123. For example, in the present embodiment, the shortest distance is the distance between the electrode pad 123 disposed above the insulation layer 124 and the touch surface 130s, and thus the distance H1 is the distance between the electrode pad 123 and the touch surface 130s. In one embodiment, the cover layer 130 may be made of polyethylene terephthalate (PET), poly(ethylene glycol)2,6-naphthalate (PEN), polyethylene terephthalate dimethyl cyclohexane (PCT), polyether sulfone (PES), polymethyl methacrylate (PMMA), polycarbonate (PC), glass, photoresistor, SiNx, SiOx, polymer resin composed of acrylic acid or combination thereof. In addition, the cover layer 130 may have single layer or multi layers. In terms of multi layers, each layer may be made of one or the combination of the aforementioned materials.

In the present embodiment, as shown in the enlargement diagram of FIG. 1A, the number of the electrode pad 123 is single and extends in a straight; however, such exemplification is not meant to be for limiting.

Figure 3A:
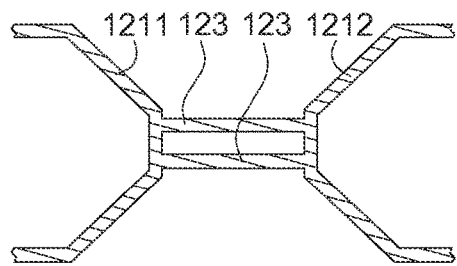
FIGS. 3A to 3E show top views of a plurality of electrode pads according to others embodiment of the disclosure.
Figure 3B:
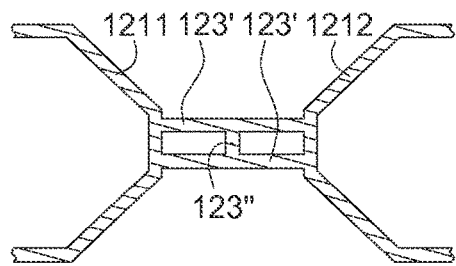
Figure 3C:
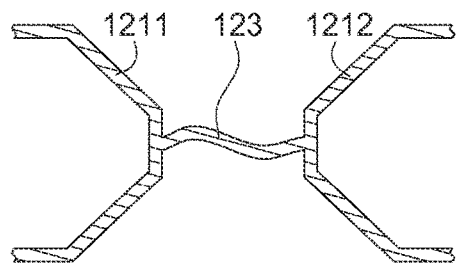
Figure 3D:
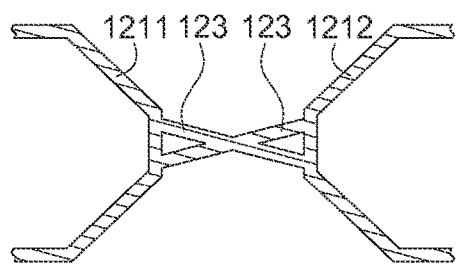
Figure 3E:
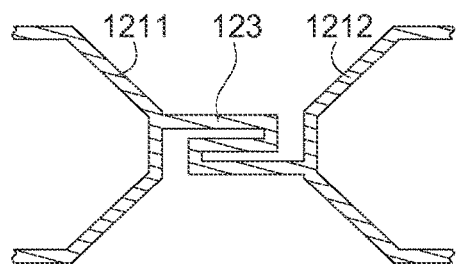

Referring to FIGS. 3A to 3E, top views of a plurality of electrode pads according to other embodiments of the disclosure are shown. As shown in FIG. 3A, the number of the electrode pads 123 may be two or more, and two terminals of each electrode pad 123 connect the first sub-electrode 1211 and the second sub-electrode 1212. As shown in FIG. 3B, the number of the electrode pads 123 may be several, such as the first electrode pad 123' and the second electrode pad 123", wherein two terminals of the first electrode pad 123' connect the first sub-electrode 1211 and the second sub-electrode 1212, and two terminals of the second electrode pad 123" connect the first electrode pads 123'. As shown in FIG. 3C, the electrode pad 123 may extend in a curved line, and two terminals of the electrode pad 123 connect the first sub-electrode 1211 and the second sub-electrode 1212. As shown in FIG. 3D, two electrode pads 123 may intersect and two terminals of each electrode pad 123 connect the first sub-electrode 1211 and the second sub-electrode 1212. As shown in FIG. 3E, the electrode pad 123 may extend in a circuitous line, and two terminals of the electrode pad 123 connect the first sub-electrode 1211 and the second sub-electrode 1212.

As described above, the number of the electrode pads 123 may be single or several, the electrode pad 123 may extend in a straight, a curved line or a circuitous line, two electrode pads 123 may be parallel to each other or intersect, and/or one or some of several electrode pads 123 may connect with another or others of the electrode pads 123. That is, the electrode pad 123 may connect the first sub-electrode 1211 and the second sub-electrode 1212, and the present disclosure is not limited to the number of the electrode pad 123 and/or extension form of the electrode pad 123.

Figure 4:
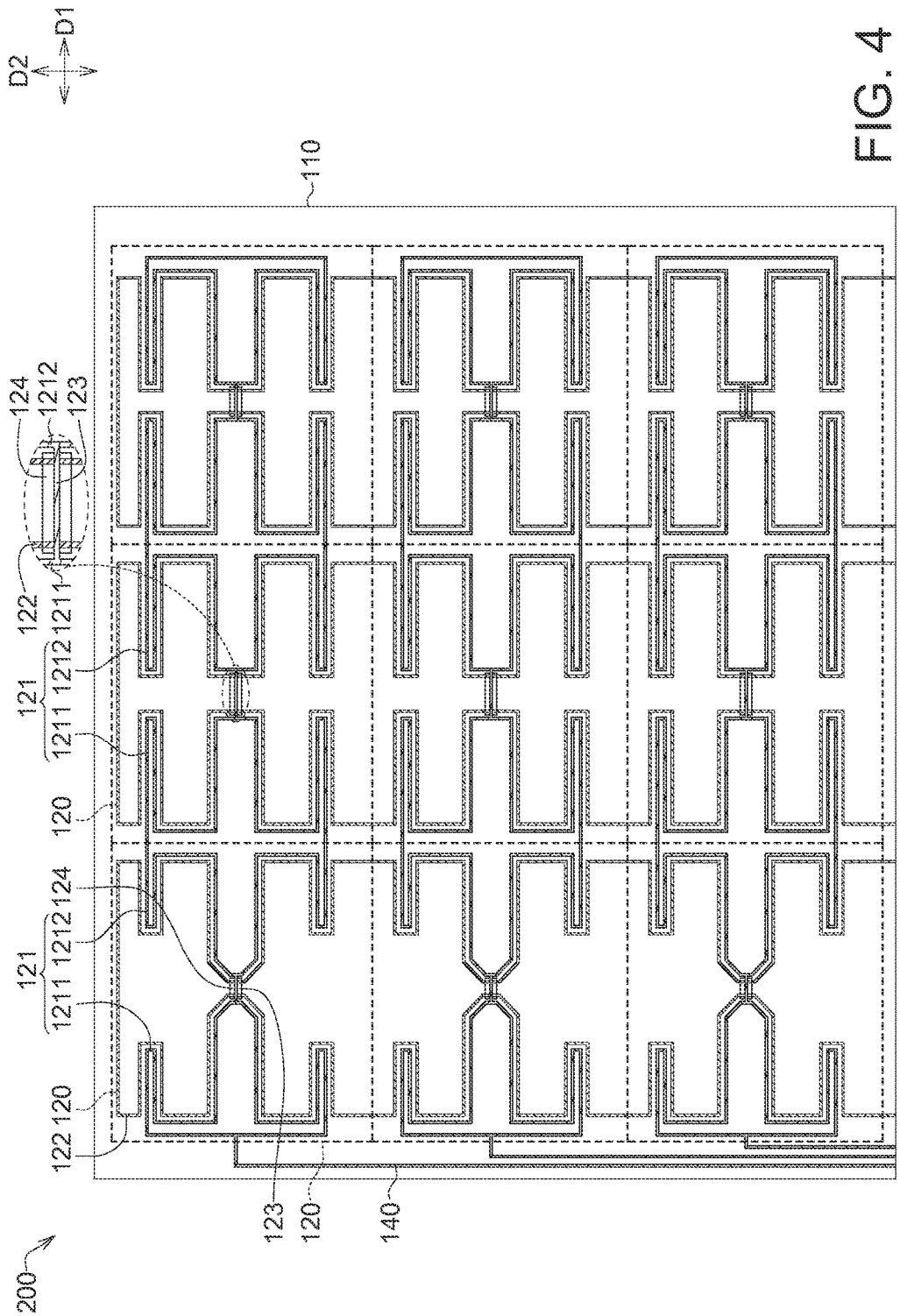
FIG. 4 shows a top view of a touch panel according to another embodiment of the disclosure.

Referring to FIG. 4, a top view of a touch panel according to another embodiment of the disclosure is shown. The touch panel 200 includes the substrate 110, a plurality of touch unit regions 120 and the cover layer 130 (not illustrated). Each touch unit region 120 may include a first electrode 121, a second electrode 122, an electrode pad 123 and an insulation layer 124. The first electrode 121 of each touch unit region 120 may include the first sub-electrode 1211 and the second sub-electrode 1212 separated from the first sub-electrode 1211. In the present embodiment, the second sub-electrode 1212 of one touch unit region 120 and the first sub-electrode 1211 of the adjacent touch unit region 120 may be designed as a symmetrical structure. In addition, in the touch panel 200, the first sub-electrode 1211 of one touch unit region 120 and the first sub-electrode 1211 of the adjacent touch unit region 120 may have different structures and/or the second sub-electrode 1212 of one touch unit region 120 and the second sub-electrode 1212 of the adjacent touch unit region 120 may have different structures. In one embodiment, the touch panel 200 further includes a plurality of signal traces 140 each connecting with the corresponding first axial electrode (which consists of several first electrodes 121 in the same row) and extending to a side of the substrate 110 for transmitting signal for the corresponding first axial electrode.

Figure 5:
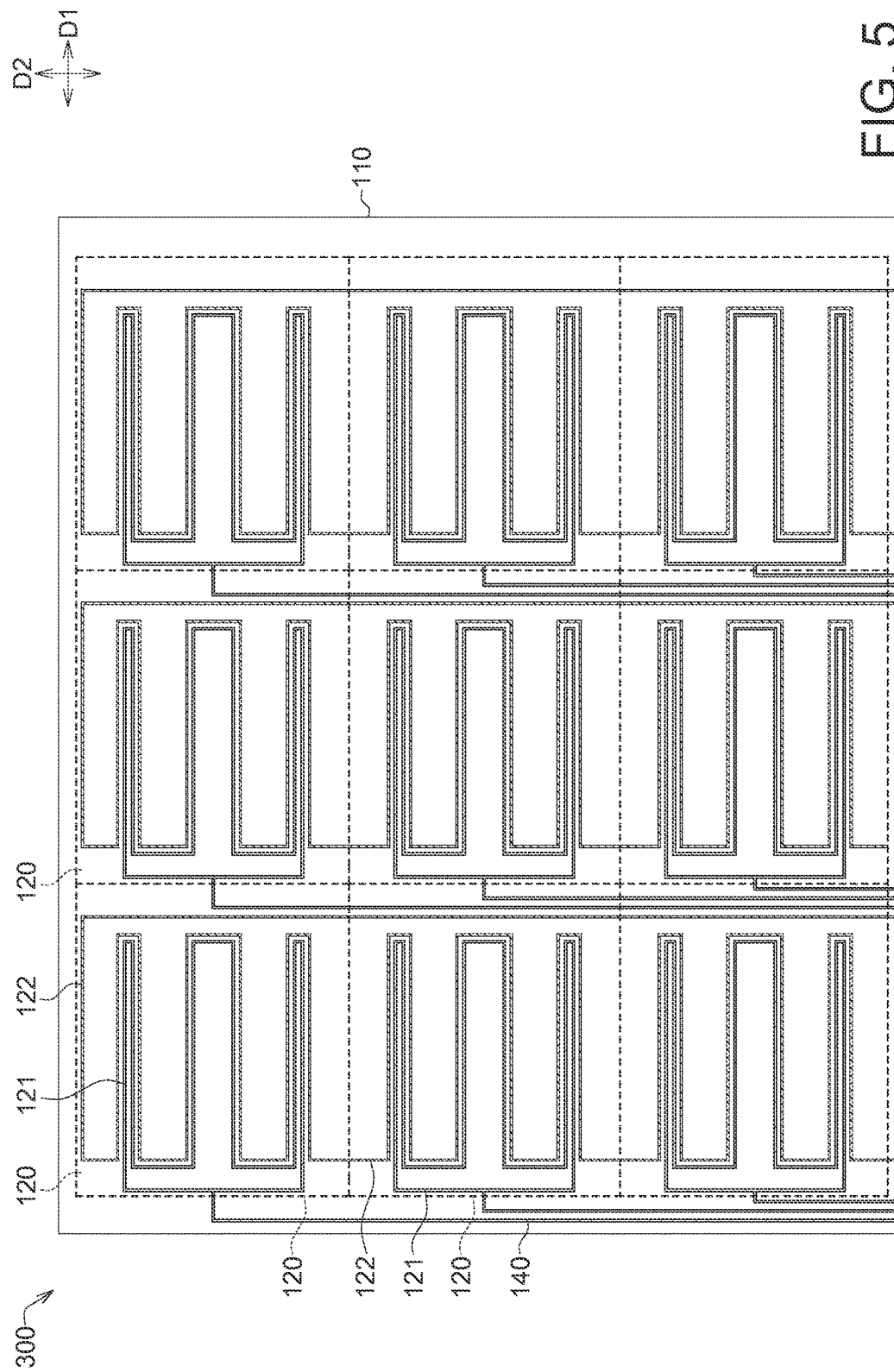
FIG. 5 shows a top view of a touch panel according to another embodiment of the disclosure.

Referring to FIG. 5, a top view of a touch panel according to another embodiment of the disclosure is shown. The touch panel 300 includes the substrate 110, a plurality of touch unit regions 120 and the cover layer 130 (not illustrated).

Each touch unit region 120 includes the first electrode 121 and the second electrode 122. The second electrodes 122 of adjacent two touch unit regions 120 in the same column (in second direction D2, for example) connect with each other to form a second axial electrode. In the present embodiment, the second axial electrode may serve as a scan electrode, and the first electrode 121 may serve as a sensing electrode; however, such exemplification is not meant to be for limiting.

Similar to aforementioned embodiment, the electrode wires may wind to form the first electrode 121 and the second electrode 122. In one touch unit region 120, the electrode area of the electrode wires is less than the unit area of the touch unit region 120, and thus the occupied area by the first electrode 121 and the second electrode 122 may be reduced. As a result, the touch panel 300 further includes a plurality of signal traces 140 each connecting with the corresponding first electrode 121 and extending to a side of the substrate 110 for transmitting touch signal in the touch unit region 120.

Figure 6:
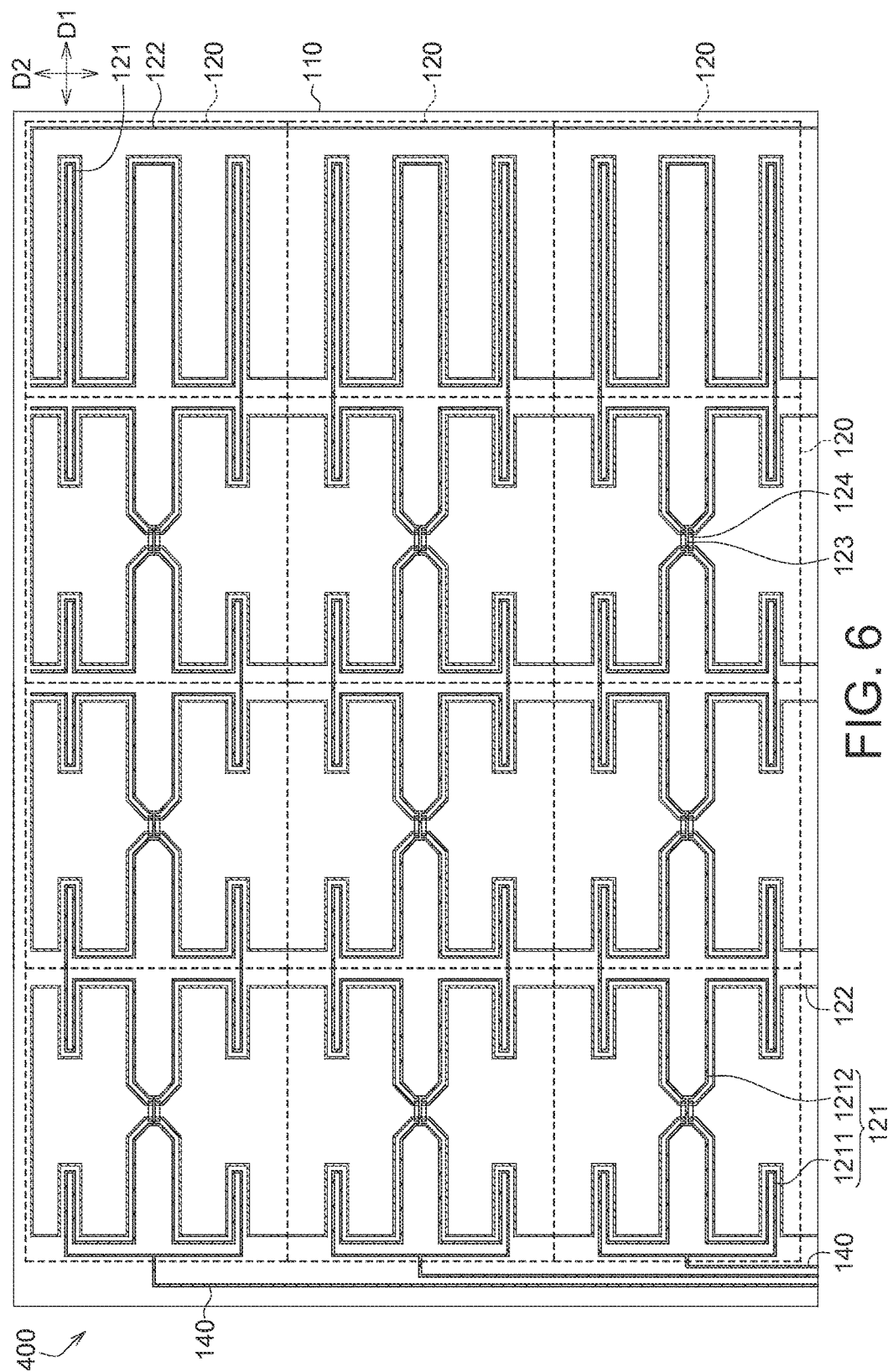
FIG. 6 shows a top view of a touch panel according to another embodiment of the disclosure.

Referring to FIG. 6, a top view of a touch panel according to another embodiment of the disclosure is shown. The touch panel 400 includes the substrate 110, a plurality of touch unit regions 120 and the cover layer 130 (not illustrated). Each touch unit region 120 may include the first electrode 121, the second electrode 122, the electrode pad 123 and the insulation layer 124.

In the present embodiment, each touch unit region 120 may omit the electrode pad 123 and the insulation layer 124 in the rightmost column (in the second direction D2, for example), and the first electrode 121 of each touch unit region 120 may include the first sub-electrode 1211 and the second sub-electrode 1212 except for the touch unit regions 120 in the rightmost column (in the second direction D2, for example).

In the present embodiment, the touch panel 400 may further include a plurality of signal traces 140 each connecting with the corresponding first axial electrode (which consists of several first electrodes 121 in the same row) and extending to a side of the substrate 110 for transmitting the signal for the first axial electrode.

Figure 7:
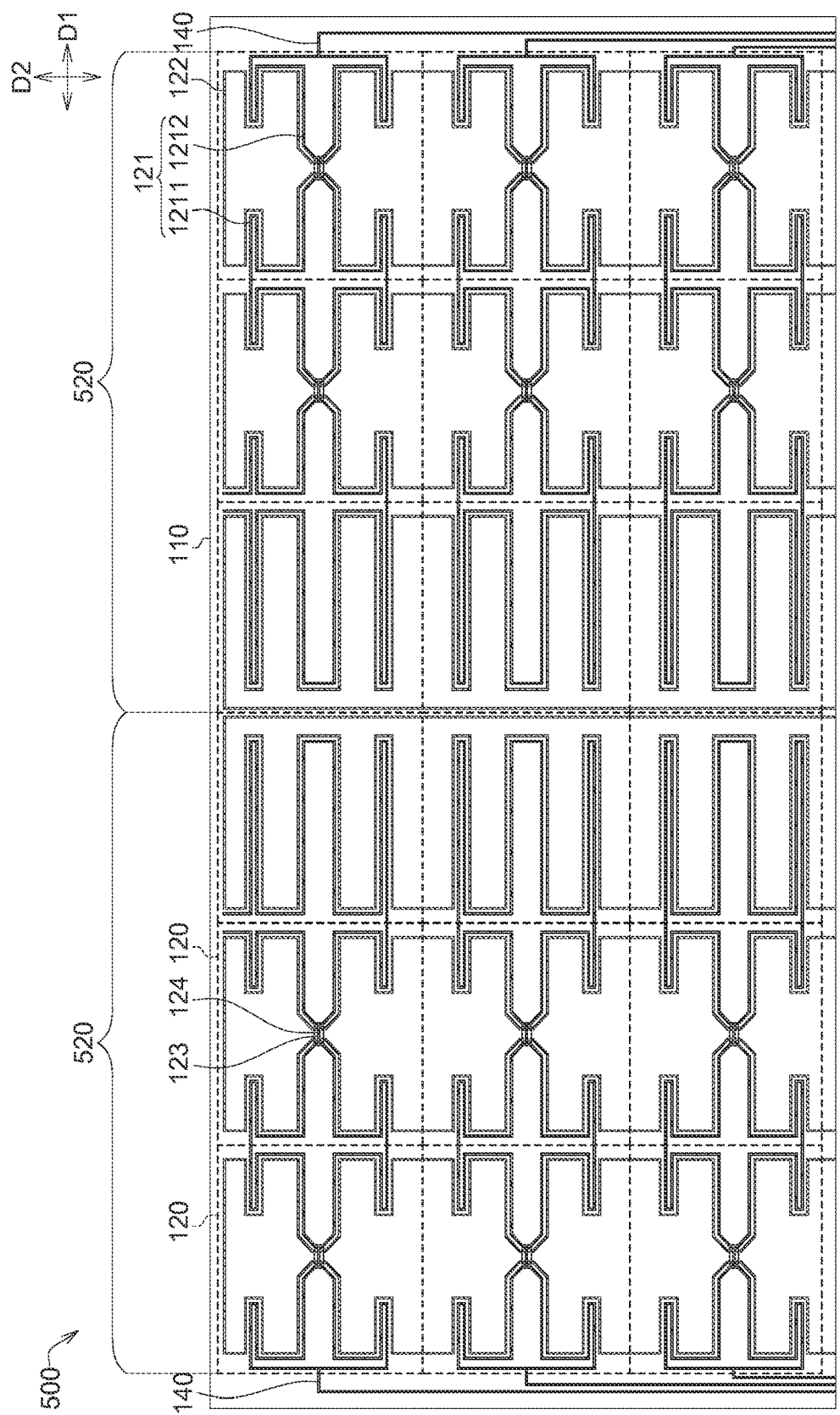
FIG. 7 shows a top view of a touch panel according to another embodiment of the disclosure.

Referring to FIG. 7, a top view of a touch panel according to another embodiment of the disclosure is shown. The touch panel 500 includes the substrate 110, a plurality of touch unit regions 120 and the cover layer 130 (not illustrated). The touch unit regions 120 may be divided into two touch regions 520. In the present embodiment, two touch regions 520 may be electrically isolated from each other. Two touch regions 520 may be two mirror structures. In addition, each touch region 520 may have pattern similar to that of the touch unit region 120 of the FIG. 1A, 4, 5 or 6. Two individual touch regions 520 may be two display regions capable of displaying two different frames respectively, such that the two touch regions 520 may be operated independently.

In addition, each touch unit region 120 may include the first electrode 121, the second electrode 122, the electrode pad 123 and the insulation layer 124. In the present embodiment, any of some touch unit regions 120 may include the first sub-electrode 1211 and the second sub-electrode 1212 separated from the first sub-electrode 1211, and others touch unit regions 120, such as the touch unit regions 120 in middle position of the touch panel 500, are not limited thereto. In one embodiment, the touch panel 500 includes a plurality of signal traces 140 each connecting with the corresponding first axial electrode (which consists of several first electrodes 121 in the same row) and extending to a side of the substrate 110 for transmitting the signal for the first axial electrode.

Figure 8A:
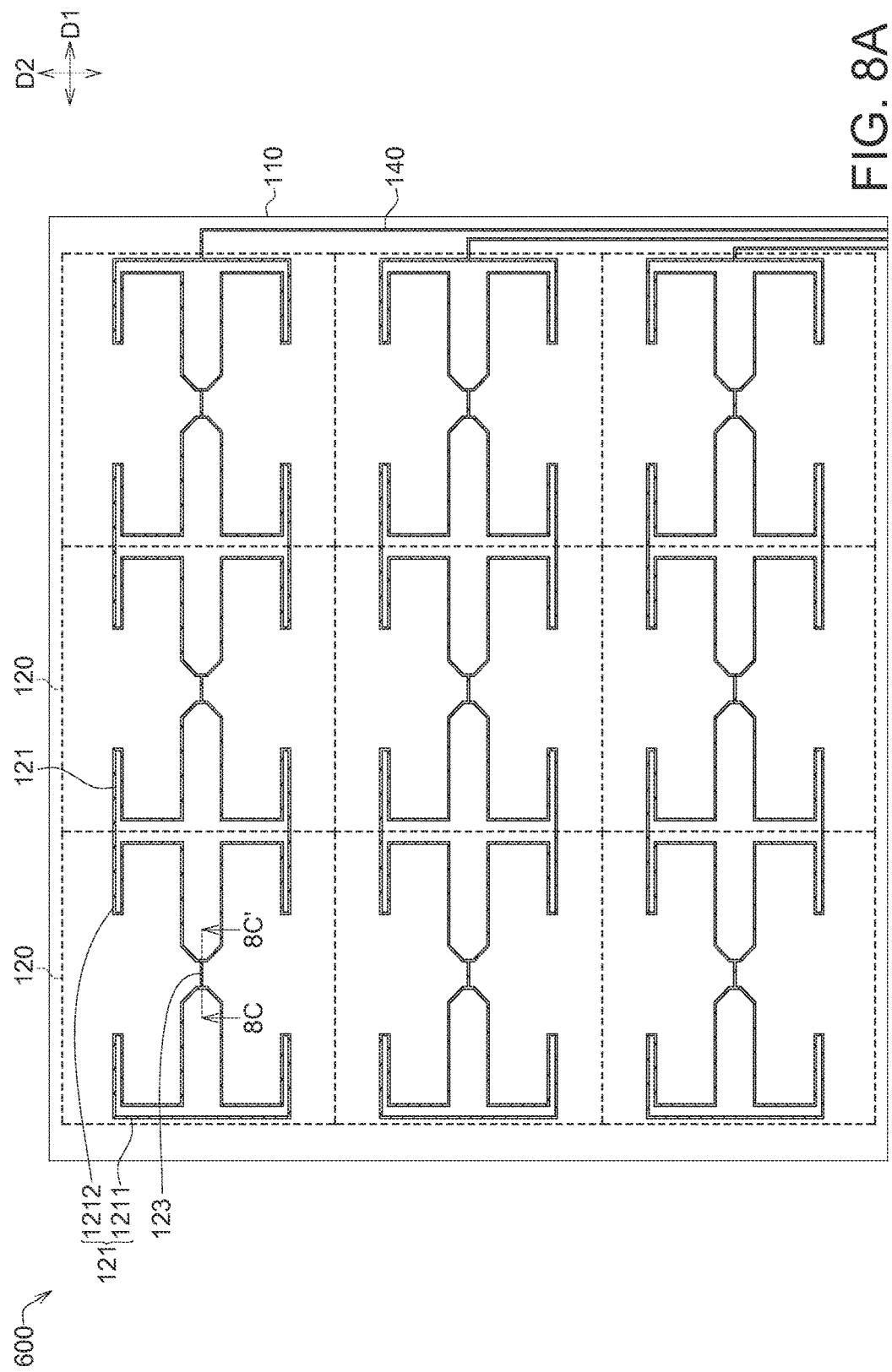
Figure 8C:
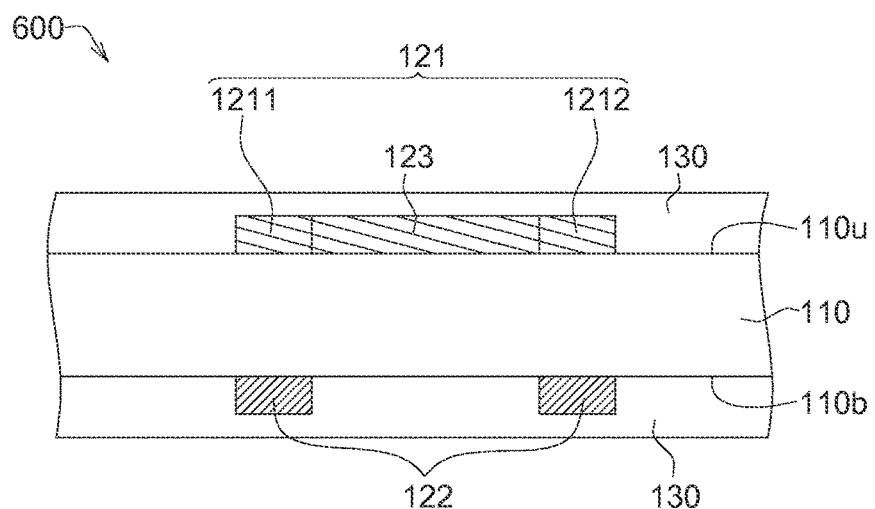

Referring to FIGS. 8A to 8C, several diagrams of a touch panel according to another embodiment of the disclosure are shown, FIG. 8A shows a top view (the second electrode 122 is not illustrated) of the first electrode 121, FIG. 8B shows a top view (the first electrode 121 is not illustrated) of the second electrode 122, and FIG. 8C shows a cross sectional view (the second electrode 122 of FIG. 8B is also illustrated) of the first electrode 121 along a line 8C-8C'.

The touch panel 600 includes the substrate 110, a plurality of touch unit regions 120 and two cover layers 130 (not illustrated). In one embodiment, the touch panel 600 may further include a plurality of signal traces 140 each connecting with the corresponding first axial electrode (which consists of several first electrodes 121 in the same row) and extending to a side of the substrate 110 for transmitting the signal for the first axial electrode.

In the present embodiment, the first electrode 121 and the second electrode 122 are formed on opposite two sides of the substrate 110. For example, the first electrode 121 and the electrode pad 123 are formed on the first surface 110u of the substrate 110, and the second electrode 122 is formed on the second surface 110b of the substrate 110, wherein the second surface 110b is opposite to the first surface 110u. In addition, the cover layers 130 cover the first electrode 121 and the second electrode 122 respectively for protecting the first electrode 121 and the second electrode 122.

Similar to the touch panel 600 of FIGS. 8A to 8C, the first electrode 121 and the second electrode 122 of FIG. 1A, 4, 5, 6 or 7 may be formed on opposite two sides of the substrate 110.

Figure 9:
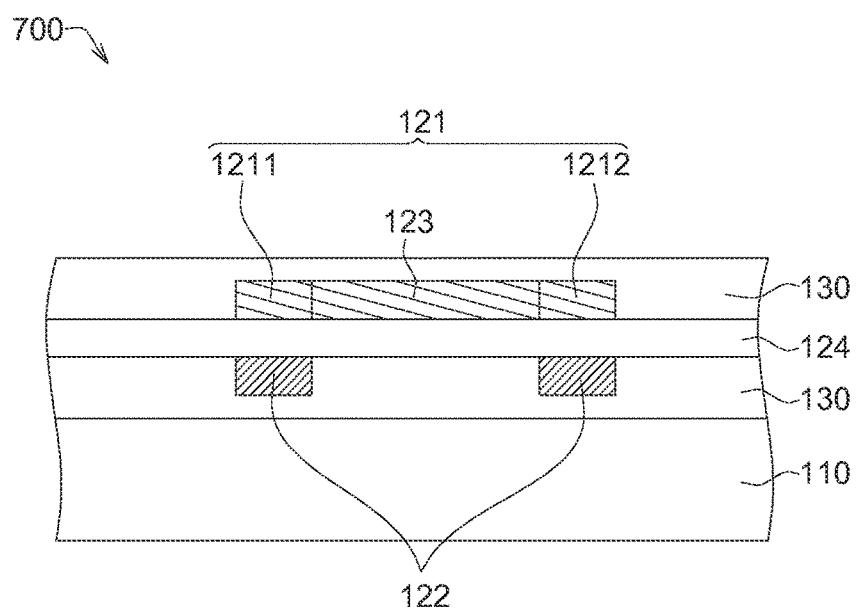
FIG. 9 shows a cross sectional view of a touch panel according to another embodiment of the disclosure.

Referring to FIG. 9, a cross sectional view of a touch panel according to another embodiment of the disclosure is shown. The touch panel 700 includes the substrate 110, a plurality of touch unit regions 120 and two cover layers 130 (not illustrated). In the present embodiment, the touch unit region 120 and the cover layers 130 may be formed on the same side of the substrate 110. Each touch unit region 120 may include the first electrode 121, the second electrode 122 and the insulation layer 124, wherein the first electrode 121 and the second electrode 12 are formed on opposite two sides of the insulation layer 124 to be separated by the insulation layer 124 for preventing from electrically short with each other. In addition, one of the cover layers 130 may cover the first electrode 121, and another cover layer 130 may cover the second electrode 122.

In one embodiment, the touch panel 700 further includes a plurality of signal traces 140. A connecting relationship between the signal traces 140 and the touch unit regions 120 may be similar to the connecting relationship between the signal traces 140 and the touch unit regions 120 of FIG. 7, and the similarity is not repeated.

Figure 10:
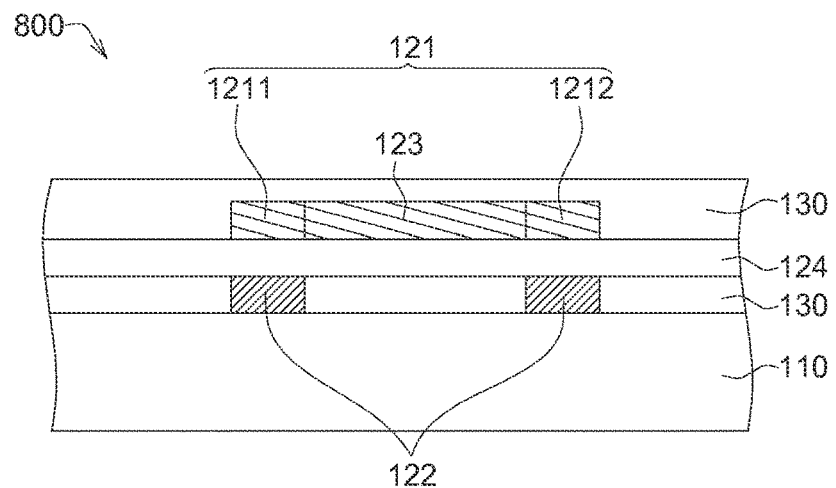
FIG. 10 shows a cross sectional view of a touch panel according to another embodiment of the disclosure.

Referring to FIG. 10, a cross sectional view of a touch panel according to another embodiment of the disclosure is shown. The touch panel 800 includes the substrate 110, a plurality of touch unit regions 120 (not illustrated) and two cover layers 130. In the present embodiment, the touch unit region 120 and the cover layers 130 may be formed on the same side of the substrate 110. Each touch unit region 120 may include the first electrode 121, the second electrode 122 and the insulation layer 124, wherein the first electrode 121 and the second electrode 12 are formed on opposite two sides of the insulation layer 124 to be separated by the insulation layer 124 for preventing from electrically short with each other. The touch panel 800 and the touch panel 700 of FIG. 9 are different in that the second electrode 122 of the touch panel 800 may contact with the substrate 110.

In one embodiment, the touch panel 800 may further include a plurality of signal traces 140. A connecting relationship between the signal traces 140 and the touch unit regions 120 may be similar to the connecting relationship between the signal traces 140 and the touch unit regions 120 of FIG. 7, and the similarity is not repeated.

Figure 11:
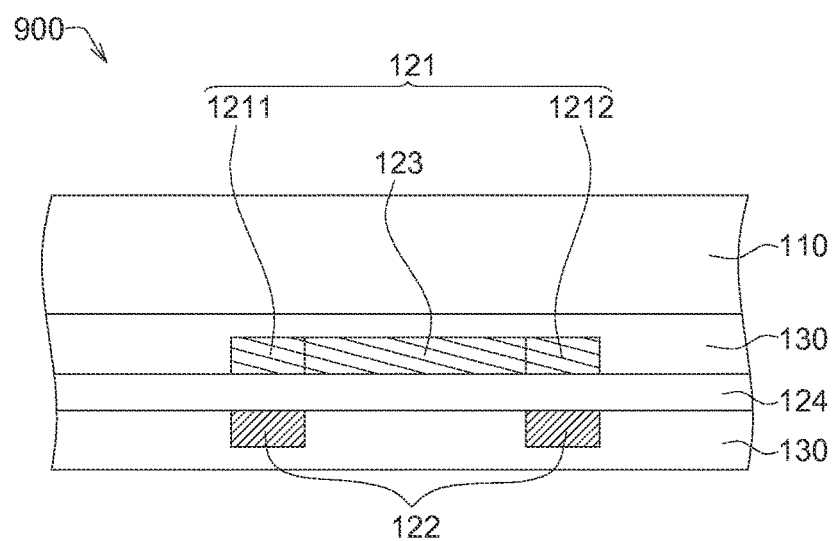
FIG. 11 shows a cross sectional view of a touch panel according to another embodiment of the disclosure.

Referring to FIG. 11, a cross sectional view of a touch panel according to another embodiment of the disclosure is shown. The touch panel 900 includes the substrate 110, a plurality of touch unit regions 120 (not illustrated) and two cover layers 130. In the present embodiment, the touch unit region 120 and the cover layers 130 may be formed on the same side of the substrate 110. Each touch unit region 120 may include the first electrode 121, the second electrode 122 and the insulation layer 124, wherein the first electrode 121 and the second electrode 12 are formed on opposite two sides of the insulation layer 124 to be separated by the insulation layer 124 for preventing from electrically short with each other. The touch panel 900 is different from the touch panel 700 of FIG. 9 and the touch panel 800 of FIG. 10 in that the first electrode 121 of the touch panel 900 may be closer to the substrate 110 than the second electrode 122 is.

In one embodiment, the touch panel 900 may further include a plurality of signal traces 140. A connecting relationship between the signal traces 140 and the touch unit regions 120 may be similar to the connecting relationship between the signal traces 140 and the touch unit regions 120 of FIG. 7, and the similarity is not repeated.

Figure 12:
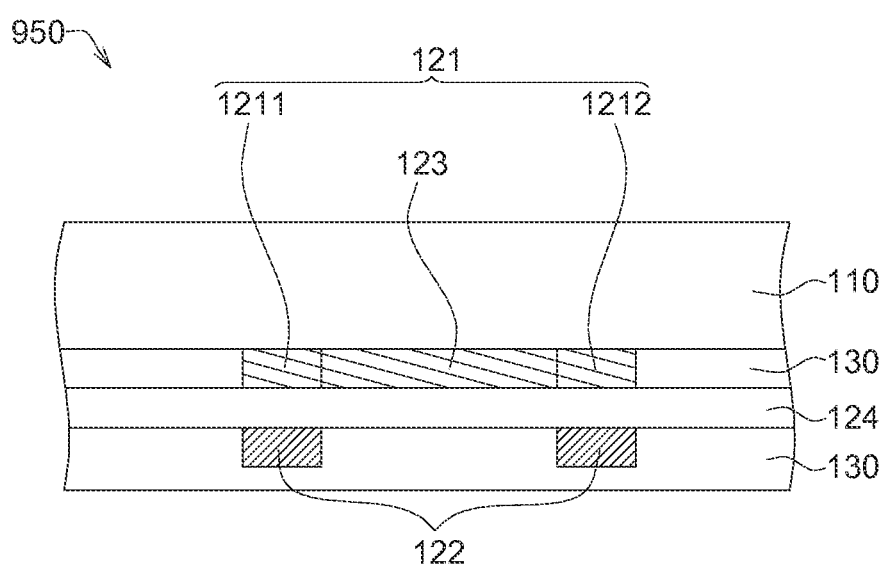
FIG. 12 shows a cross sectional view of a touch panel according to another embodiment of the disclosure.

Referring to FIG. 12, a cross sectional view of a touch panel according to another embodiment of the disclosure is shown. The touch panel 950 includes the substrate 110, a plurality of touch unit regions 120 (not illustrated) and two cover layers 130. In the present embodiment, the touch unit region 120 and the cover layers 130 may be formed on the same side of the substrate 110. Each touch unit region 120 may include the first electrode 121, the second electrode 122 and the insulation layer 124, wherein the first electrode 121 and the second electrode 12 are formed on opposite two sides of the insulation layer 124 to be separated by the insulation layer 124 for preventing from electrically short with each other. The touch panel 950 is different from the touch panel 900 of FIG. 11 in that the first electrode 121 and the electrode pad 123 of the touch panel 950 may contact with the substrate 110.

In one embodiment, the touch panel 950 may further include a plurality of signal traces 140. A connecting relationship between the signal traces 140 and the touch unit regions 120 may be similar to the connecting relationship between the signal traces 140 and the touch unit regions 120 of FIG. 7, and the similarity is not repeated.

As described above, the touch panels of the embodiments at least have the following advantages:

(1). in one embodiment, since the electrode wires may wind to form the first electrode 121 and/or the second electrode 122, the self capacitance value of the first electrode 121 and/or the self capacitance value of the second electrode 122 may be reduced, and the allowed self capacitance increase time may be increased. As a result, the problem of the error response point may be resolved.

(2). in one embodiment, since the first electrode 121 and/or the second electrode 122 have low self capacitance values, the allowed self capacitance increase time may be increased. As a result, even though the cover lens is thinned or omitted, or the insulation layer is omitted, the self capacitance increase time after the touch is still lower than the allowed self capacitance increase time, and accordingly the problem of the error response point may be resolved.

(3). in one embodiment, the first electrode 121 may be shaped into wire shape and/or the second electrode 122 may be shaped into wire shape, and accordingly the first electrode 121 and/or the second electrode 122 may have various patterns.

(4). in one embodiment, since the first electrode 121 and/or the second electrode 122 may be shaped into wire shapes, and accordingly the design parameters of the self capacitance value of the first electrode 121 and/or the self capacitance value of the second electrode 122 may be increased through the designs of the width of the electrode, the ratio of the electrode area to the unit area of the touch unit region, the extension form of the electrode, the thickness of the electrode and/or the size of the electrode pad. As a result, the design flexibility in the first electrode 121 and/or the second electrode 122 may be increased.

It will be clear that various modifications and variations can be made to the disclosed embodiments. It is intended that the specification and examples be considered as exemplary only, with a true scope of the disclosure being indicated by the following claims and their equivalents.

What is claimed is:

1. A touch panel, comprising:
   a substrate;
   a touch unit region, comprising:
   a first electrode including an electrode pad; and
   a second electrode separated from the first electrode; and
   a covering layer covering at least one of the first electrode and the second electrode and having a touch surface, wherein a shortest distance between the touch surface and the first electrode ranges between 0.01 micrometers and 100 micrometers;
   wherein the first electrode or the second electrode is formed by winding electrode wires, each of the first electrode or the second electrode comprising:
   a first conductive layer;
   a second conductive layer contacting with the first conductive layer;
   wherein a conductivity of one of the first conductive layer and the second conductive layer is greater than a conductivity of another of the first conductive layer and the second conductive layer, and one of the first conductive layer and the second conductive layer is made of a transparent material, and
   wherein the first electrode has a first base self capacitance value when the touch has not occurred yet, the first electrode has a first increase self capacitance value when the touch has occurred, and a ratio of the first increase self capacitance value to the first base self capacitance value is larger than 10 and less than 37.

2. The touch panel according to claim 1, wherein the second electrode has a second base self capacitance value when the touch has not occurred yet, the second electrode has a second increase self capacitance value when the touch has occurred, and a ratio of the second increase self capacitance value to the second base self capacitance value is larger than 1 and less than 37.

3. The touch panel according to claim 1, wherein the touch unit region has a unit area, the first electrode and the second electrode occupy an electrode area in the touch unit region, and a ratio between the electrode area to the unit area is less than 50%.

4. The touch panel according to claim 1, wherein a unit area of the touch unit region ranges between 9 mm2 and 49 mm2.

5. The touch panel according to claim 1, wherein the first electrode and the second electrode are formed on the same side of the substrate, and a shortest distance between the touch surface and the second electrode is greater than a sum of a thickness of the cover layer and a thickness of the electrode pad.

6. The touch panel according to claim 1, wherein the first electrode and the second electrode are formed on opposite two sides of the substrate respectively, and a shortest distance between the touch surface and the first electrode or between the touch surface and the second electrode ranges 0.01 micrometers and 100 micrometers.

7. The touch panel according to claim 1, wherein the first electrode comprises a first sub-electrode and a second sub-electrode separated from the first sub-electrode, the electrode pad connects the first sub-electrode and the second sub-electrode, and the touch panel further comprises:
   an insulation layer separated from the second electrode.

8. The touch panel according to claim 7, wherein the first sub-electrode and the second sub-electrode form a symmetrical structure.

9. The touch panel according to claim 1, further comprising: a plurality of the touch unit regions, wherein the first electrodes of two adjacent touch unit regions are connected with each other, and the second electrodes of two adjacent touch unit regions are connected with each other.

10. The touch panel according to claim 9, wherein each first electrode comprises a first sub-electrode and a second sub-electrode separated from the first sub-electrode, and the second sub-electrode of one of the touch unit regions connecting with the first sub-electrode of the adjacent touch unit region form a symmetrical structure.

11. The touch panel according to claim 1, further comprises:
   a plurality of the touch unit regions, wherein the first electrode of one of the touch unit regions connecting with the first electrode of the adjacent touch unit region form a symmetrical structure.

12. The touch panel according to claim 1, wherein an interval between the first electrode and the second electrode ranges 5 micrometers and 200 micrometers.

13. The touch panel according to claim 1, wherein a width of the first electrode ranges 5 micrometers and 200 micrometers, and a width of the second electrode ranges 5 micrometers and 200 micrometers.

14. The touch panel according to claim 1, wherein a thickness of the first electrode ranges 0.01 micrometers and 5 micrometers, and a thickness of the second electrode ranges 0.01 micrometers and 5 micrometers.

15. The touch panel according to claim 1, wherein a thickness of the electrode pad ranges 0.01 micrometers and 5 micrometers.

16. A touch panel, comprising:
   a substrate;
   a touch unit region, comprising:
   a first electrode including an electrode pad; and
   a second electrode separated from the first electrode; and
   a covering layer covering at least one of the first electrode and the second electrode and having a touch surface, wherein a shortest distance between the touch surface and the first electrode ranges between 0.01 micrometers and 100 micrometers;

wherein the first electrode has a first base self capacitance value when the touch has not occurred yet, the first electrode has a first increase self capacitance value when the touch has occurred, and a ratio of the first increase self capacitance value to the first base self capacitance value is larger than 10 and less than 37.

* * * * *